United States Patent [19]

Waller

[11] Patent Number: 4,730,276

[45] Date of Patent: Mar. 8, 1988

[54] SEMICONDUCTOR MEMORIES

[75] Inventor: David L. Waller, Swanley, Great Britain

[73] Assignee: STC PLC, London, England

[21] Appl. No.: 873,388

[22] Filed: Jun. 12, 1986

[30] Foreign Application Priority Data

Jun. 12, 1985 [GB] United Kingdom ............... 8514924

[51] Int. Cl.⁴ ....................... G11C 11/36; G11C 13/00
[52] U.S. Cl. .................................................. 365/189
[58] Field of Search ............... 365/154, 189, 230, 175

[56] References Cited

U.S. PATENT DOCUMENTS 4,601,016  7/1986  Roberts .............................. 365/175

Primary Examiner—Terrell W. Fears
Attorney, Agent, or Firm—Lee, Smith & Zickert

[57] ABSTRACT

A bit-line load for a static random access memory incorporates a load comprising a diode, and current limiting means in series with the diode, the diode/limiter assembly being shunted by a current source. This overcomes both the $V_{dd}$ drop problem and the high write cycle current flow experienced with conventional bit line loads.

5 Claims, 4 Drawing Figures

SEMICONDUCTOR MEMORIES

BACKGROUND OF THE INVENTION

This invention relates to static random access memories and in particular to a bit-line load for use in such memories.

The conventional diode bit-line load commonly used in static random access memories suffers from two serious disadvantages. The first of these is the so called $V_{dd}$ bump problem whereby a fall in the $V_{dd}$ voltage e.g. from $V_1$ to $V_2$ traps the bit-line at a voltage equal to $V_1-V_{T1}$ (where $V_{T1}$ is the diode threshold voltage) rather than the desired voltage $V_2-V_{T1}$. On a subsequent access the memory cell must then discharge the bit-line by an additional voltage equal to $V_1-V_2$ resulting in a slow access on this particular cycle.

The second problem with conventional diode loads in the relatively high $V_{dd}$ current associated with the write cycle. For example, in a conventional memory, the current flowing through a bit-line can be increased by two orders of magnitude over the current flowing during a read cycle. This problem is of course accentuated with wide memories where many bit-lines may be written to causing a large current drain, for example byte wide memories where eight bit-lines will be written to simultaneously.

The object of the present invention is to minimise or to overcome these disadvantages.

SUMMARY OF THE INVENTION

According to the invention there is provided a static random access memory, including an array of memory cells, and a plurality of bit-lines whereby the cells are accessed to effect reading and writing of data, wherein each bit-line is provided with a load comprising a diode or diode equivalent, current limiting means in series with the diode, and a current source in parallel with the diode and limiting means.

BRIEF DESCRIPTION OF THE DRAWINGS

An embodiment of the invention will now be described with reference to the accompanying drawings in which.

DETAILED DESCRIPTION OF A PREFERRED EMBODIMENT

Figure 1:
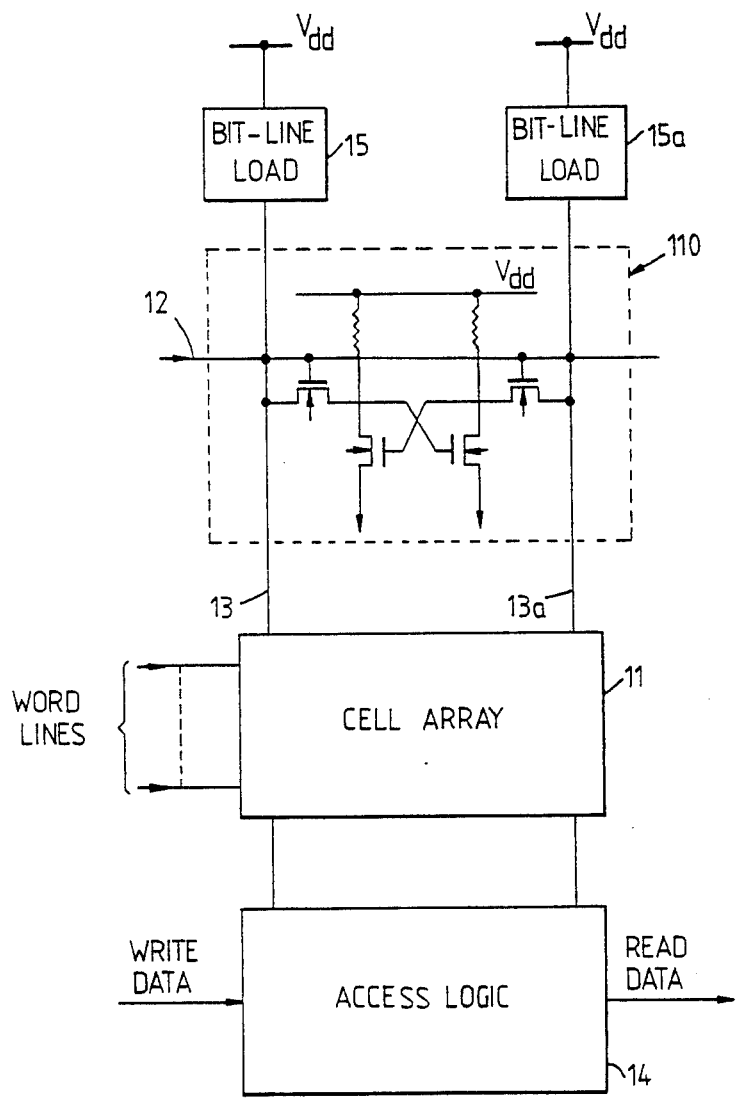
FIG. 1 is a schematic diagram of a static random access memory.
Figure 2:
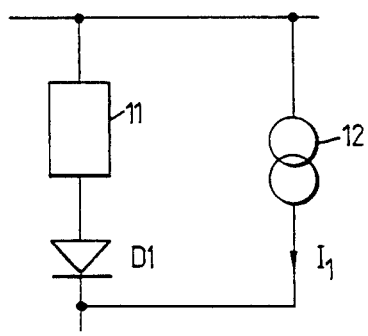
FIG. 2 is a schematic diagram of the bit-line load of the memory of FIG. 1.

Referring to FIG. 1, the memory includes a cell array 11 of which an individual cell is shown at 110. The cell 110 typically comprises a four transistor bistable circuit and is accessed via a word line 12 and bit lines 13, 13a. Access to the cell array is provided via an access logic circuit 14 having a write input and a read output. Each bit-line is coupled to the circuit $V_{dd}$ rail via a load 15, 15a. As shown in FIG. 2, each bit-line load includes a diode D1 coupled in series with a current limiting device 11 to the memory supply rail ($V_{dd}$). The diode clamps the bit-line low voltage during a memory read cycle. The series arrangement of the diode and limiter is shunted by a current source 12. This current source serves to pull the bit-line to a high level equal to $V_{dd}$. The combination of the current source, diode and limiter ensures that the bit-line current that flows during a memory write cycle is closely similar to the current that flows during a read cycle. The net result is an enhancement of the operating speed of the memory.

Figure 3:
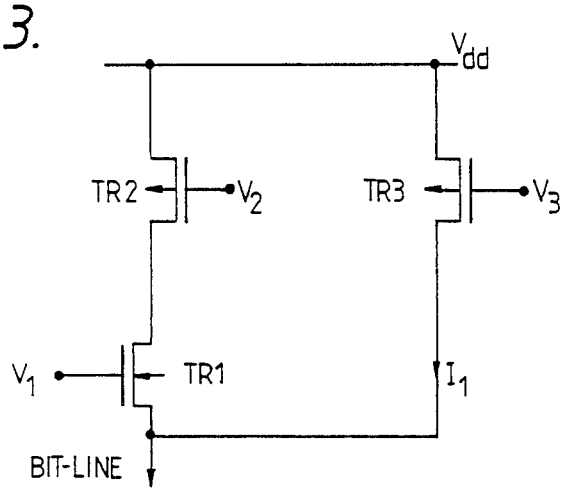
FIG. 3 shows a circuit construction of the bit-line load of FIG. 2.

A typical load circuit construction is shown in FIG. 3. The diode is provided by an n-channel transistor TR1 whose gate is maintained at a voltage $V_1$. This voltage $V_1$ defines the bit-line low voltage which would therefore be $V_1-V_{T1}$, as described earlier. $V_1$ is typically equal to $V_{dd}$. Current flow through the transistor TR1 is limited by a series connected p-channel transistor TR2 connected to the drain of TR1. The gate of transistor TR2 is supplied with a voltage $V_2$. Optionally $V_2$ is chosen such that transistor TR2 is biassed into its resistive mode, i.e. into the linear operating region, or into its constant current mode, i.e. the saturated operating region.

Figure 4:
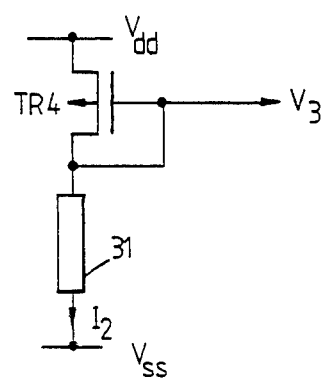
FIG. 4 shows a reference voltage generator for use with the load of FIGS. 2 and 3.

A further p-channel transistor TR3 is coupled between the supply line and the source of transistor TR1 such that the current path of TR3 shunts the diode and limiter. The transistor TR3 is biassed by a voltage $V_3$ applied to its gate. Preferably $V_3$ is chosen so as to bias transistor TR3 into the constant current mode, i.e. the saturated operating region. Typically $V_3$ would be a common reference mode used by all bit-line loads, a suitable circuit for generating this reference is shown in FIG. 4. A p-channel transistor TR4 is biassed with its source connected to the memory supply rail ($V_{dd}$) and its gate and drain connected together to the reference supply rail ($V_3$). The transistor is biassed on by the network 13 connected between the reference supply rail ($V_3$) and the memory ground rail ($V_{ss}$).

Transistor TR3 (FIG. 3) performs the secondary function of solving the so called V Bump problem. Should $V_{dd}$ rise from, for example, $V_2$ to $V_1$, then the bit line high level will rise from $V_2$ to $V_1$ through transistor TR3, and the bit line low level will rise from $V_2-V_{T1}$ through transistor TR1 and TR2. Should $V_{dd}$ fall from, for example, $V_1$ to $V_2$ then the bit line high level will fall from $V_1$ to $V_2$ through transistor TR3, and the bit line low level will fall from $V_1-V_{T1}$ to $V_2-V_{T1}$ through the accessed memory cell.

What is claimed is:

1. A static random access memory, including an array of memory cells, and a plurality of bit-lines whereby the cells are accessed to effect reading and writing of data, wherein each bit-line is provided with a load comprising a diode or diode equivalent, current limiting means in series with the diode, and a current source in parallel with the diode and limiting means.

2. A memory as claimed in claim 1, wherein said diode and limiting means comprise a series connected complementary transistor pair.

3. A memory as claimed in claim 2, wherein the transistor comprising the current limiting means is biassed into its linear operating region.

4. A memory as claimed in claim 1, wherein the current source comprises a p-channel transistor.

5. A memory as claimed in claim 4, wherein the p-channel transistor is biassed into its saturated operating region.

* * * * *